United States Patent
Meynen et al.

(10) Patent No.: US 6,541,842 B2
(45) Date of Patent: Apr. 1, 2003

(54) METAL BARRIER BEHAVIOR BY SIC:H DEPOSITION ON POROUS MATERIALS

(75) Inventors: Herman Meynen, Lubbeek (BE); William Kenneth Weidner, Bay City, MI (US); Francesca Iacopi, Leuven (BE); Stephane Malhouitre, Kessel-Lo (BE)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/183,810

(22) Filed: Jun. 25, 2002

(65) Prior Publication Data

US 2003/0001282 A1 Jan. 2, 2003

Related U.S. Application Data

(60) Provisional application No. 60/302,469, filed on Jul. 2, 2001.

(51) Int. Cl.[7] ............................................. H01L 23/58
(52) U.S. Cl. .................................... 257/632; 257/777
(58) Field of Search ........................ 257/77, 777, 778, 257/784, 678, 661, 663, 632

(56) References Cited

U.S. PATENT DOCUMENTS

| 5,103,285 A | * | 4/1992 | Furumura et al. ............ 357/68 |
| 5,818,071 A | * | 10/1998 | Loboda et al. ................ 257/77 |
| 6,231,989 B1 | * | 5/2001 | Chung et al. ................ 428/447 |

* cited by examiner

Primary Examiner—David Nelms
Assistant Examiner—David Nhu
(74) Attorney, Agent, or Firm—Sharon K. Severance

(57) ABSTRACT

A sealing dielectric layer is applied between a porous dielectric layer and a metal diffusion barrier layer. The sealing dielectric layer closes the pores on the surface and sidewalls of the porous dielectric layer. This invention allows the use of a thin metal diffusion barrier layer without creating pinholes in the metal diffusion barrier layer. The sealing dielectric layer is a CVD deposited film having the composition $Si_xC_y:H_z$.

11 Claims, 2 Drawing Sheets

METAL BARRIER BEHAVIOR BY SIC:H DEPOSITION ON POROUS MATERIALS

This application claims the benefit of U.S. Provisional Application No. 60/302,469 filed Jul. 2, 2001.

FIELD OF THE INVENTION

This invention relates to the use of a sealing dielectric layer applied between a porous dielectric layer and a metal diffusion barrier layer. The sealing dielectric layer closes the pores on the surface and sidewalls of the porous dielectric layer. This invention allows the use of a thin metal diffusion barrier layer without creating pinholes in the metal diffusion barrier layer or without diffusion inside bulk of the porous material.

BACKGROUND OF THE INVENTION

Traditionally, Physical Vapor Deposition (PVD) metal barrier materials like TaN are used to prevent interconnect metals, in particular copper (Cu) from diffusing into the dielectric layer on semiconductor devices. The trend to scale down design rules has led to the requirement to start using dielectric layers with a dielectric constant (Dk) lower than 4–4.2 (what is typically achieved for PECVD oxide dielectric films). As the industry starts to use dielectric layers having lower Dk values a certain amount of porosity will be required to achieve the lower Dk value especially if films below a Dk of 2.6. ("porous dielectric films") The Dk will depend on the amount of porosity and also on the resin nature.

There are two groups of low dielectric materials, the spin-on dielectrics and CVD dielectric materials. The spin-on dielectrics can be divided in two groups, the organic and the inorganic spin-on dielectric materials. The CVD dielectric materials currently use an organosilane/organooxysilane precursor as active agent in combination with an oxidation agent to generate a low-k dielectric film. Regardless of how the low Dk films are produced, the low Dk films have a certain amount of porosity or intramolecular spacing.

The porosity in the low Dk films can cause problems with the metal diffusion barrier (e.g. the TaN layer) because there are pores inside and/or on top of the material. There is no difference between closed or open pore materials because closed pores will be etched open during the patterning of damascene structures. Both open and closed pore type of materials are sensitive to increased "pinhole" formation in the metal diffusion barrier sputtered layer on top of these patterns. The pinhole formation may lead to reliability problems and potential paths for diffusion and degradation of the metal interconnects and the dielectric. Because of this, a thick layer of metal diffusion barrier is required to seal the pores and to avoid "pinholes". Another problem is that in the case of metal barrier formation by Atomic Layer Chemical Vapor Deposition (AL CVD), in an open pore the metal barrier will be deposited inside the bulk of the low dielectric. Amorphous dielectric materials do not result in pinholes or deposition of the metal diffusion barrier layer in the bulk porous material.

This invention relates to the use of a sealing dielectric layer applied between the porous dielectric layer and the metal diffusion barrier layer. The sealing dielectric layer closes the pores on the surface and/or on the sidewall of the porous dielectric layer. This invention allows the use of thin metal diffusion barrier (e.g. TaN) layer without creating "pinholes" in the metal diffusion barrier layer.

SUMMARY OF THE INVENTION

The present invention relates to an improved integrated circuit having greater reliability. The circuit comprises a subassembly of solid-state devices formed typically on or in a silicon substrate. Metal wiring formed from conductive metals connects the devices within the subassembly. A sealing dielectric layer having a composition of $Si_xC_y:H_z$, where x has a value of 10–50, preferably 25–35 atomic percent, y has a value of 1–66, preferably 30–40 atomic % and z has a value of 0.1–66, preferably 25–35 atomic %; and $x+y+z \geq 90$ atomic % is formed on the patterned porous dielectric films. The use of a sealing dielectric layer avoids pinhole formation in the metal diffusion barrier.

DETAILED DESCRIPTION OF THE INVENTION

This invention pertains to the use of sealing dielectric layer having a composition of $Si_xC_y:H_z$ ("$Si_xC_yH_z$ film") where x has a value of 10 to 50, preferably 25 to 35 atomic percent, y has a value of 1–66, preferably 30–40 atomic % and z has a value of 0.1–66, preferably 25–35 atomic %; and $x+y+z \geq 90$ atomic %. The sealing dielectric layer is used to avoid the pinhole formation in a metal diffusion barrier and to avoid diffusion of metal atoms into a porous dielectric layer. The porous dielectric layer typically has a total porosity of 10 to 60% of the film where the connectivity of the pores is between 0 and 100%.

The use of the sealing dielectric layer in forming the semiconductor device increases the number of process steps by 2 but the use of a cluster tool can make the approach more cost effective where a CVD and etch chamber are added to the sputtering or CVD/ALCVD metal barrier cluster.

The thickness of the sealing dielectric layer is typically 8–12 nm but can be between 1 and 50 nm. The thickness of the sealing dielectric layer will be dependent of the thickness of the metal diffusion barrier, which is dependent of the step coverage, and aspect ratio of the patterns and the nature of the porous dielectric layer. For example, if 10 nm Ionized Metal Plasma ("IMP") PVD TaN is used then 10 nm of $Si_xC_y:H_z$ is required in the case of a porous dielectric layer produced from hydrogen silsesquioxane resin according to U.S. Pat. No. 6,231,989. One skilled in the art will be able to readily determine the thickness of the sealing dielectric layer.

Figure 1:
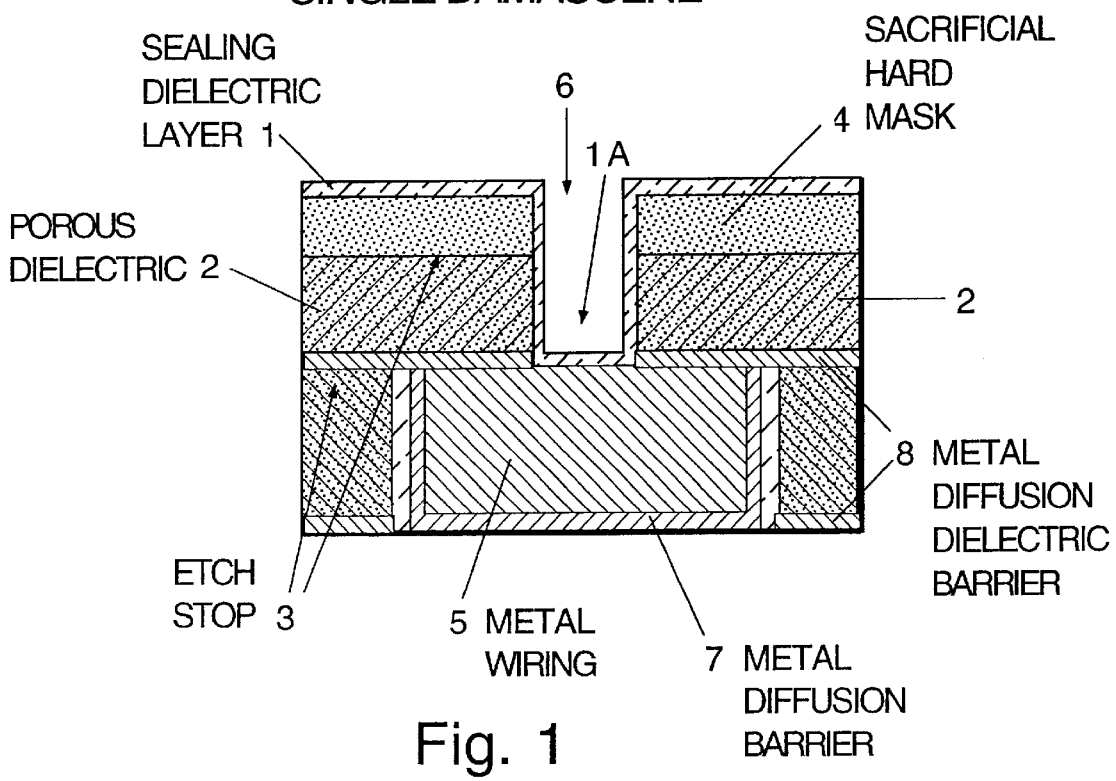
FIG. 1 is a partial cross-section of a semiconductor device according to this invention formed using single damascene technology.

The integrated circuit subassemblies used in the process of this invention are not critical and nearly any which are known in the art and/or produced commercially are useful herein. FIG. 1 represents a circuit assembly produced by single damascene technology. As can be seen in this figure, the sealing dielectric layer (1) is sealing and covering the pores in the porous dielectric layer (2). If no etch/CMP stop (3) and hard mask (4) are used then the sealing dielectric layer would also seal and cover the pores on the top surface of the porous dielectric layer. The horizontal sealing dielectric layers at the bottom and the top of the interconnect opening (1A) are removed and the metal diffusion barrier (7) is then applied over the sealing dielectric layer within the interconnect opening (6). The metal wiring (5), in this case copper (Cu) is then added into the interconnect opening (6) to fill the opening.

Another layer may then be formed by covering the metal wiring (5) with a metal wiring barrier (8). Metal wiring barrier layers (8) are known in the art. For example, U.S. Pat. No. 5,818,071, hereby incorporated by reference discloses metal wiring barrier layers of amorphous silicon carbide. The porous dielectric layer (2) is applied over the metal wiring barrier (8). An optional etch/CMP stop (3) and hard mask (4) are applied over the porous dielectric and interconnect openings are thereafter formed by removing the etch/CMP stop (3) and sacrificial hard mask (1), the porous dielectric layer (2), and the metal diffusion dielectric barrier (8) down to the metal wiring (5) of the previous layer. The sealing dielectric layer (1) is then applied. The sealing dielectric layer at the top and the bottom of the interconnect opening (1A) are removed and the metal diffusion barrier (7) is then applied over the sealing dielectric layer within the interconnect opening (6). The metal wiring (5), in this case copper (Cu) is then added into the interconnect opening (6) to fill the opening. The layering process is repeated until the desired number of layers has been formed. FIG. (1) represents two single damascene levels where one level is completely processed including filling by the metal wiring (5) and chemical mechanical polish (CMP). The processing is limited on the top level to patterning and the deposition of sealing dielectric layer (e.g. $Si_xC_y$:$H_z$) (e.g. interconnect openings (6) are not formed in the top layer).

Figure 2:
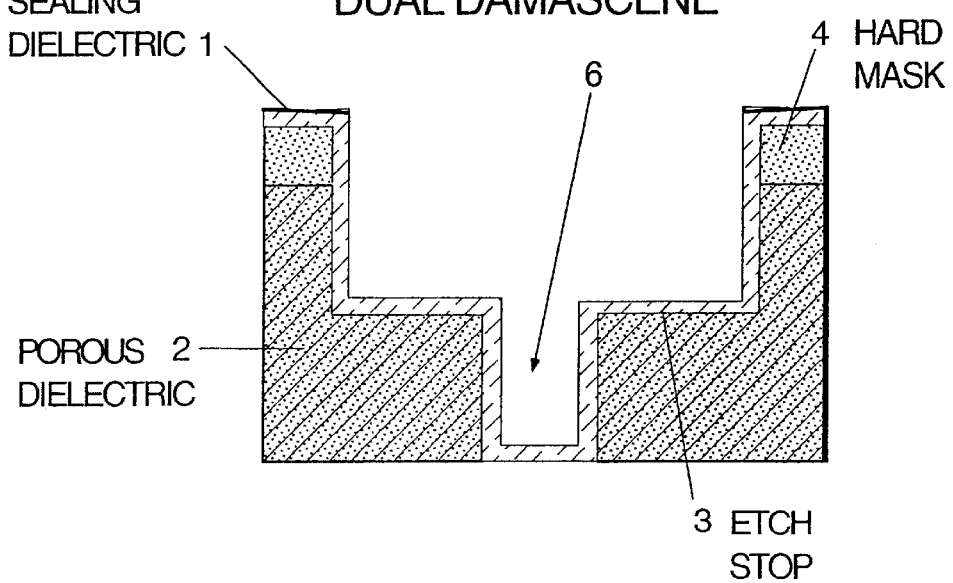
FIG. 2 is a partial cross-section of a semiconductor device according to this invention formed using dual damascene technology.

FIG. 2 represents a dual damascene structure, independent of the patterning approach (via first, partial via, trench first, dual hard mask patterning, etc.) that can be applied. As can be seen, the porous dielectric layer (2) is sealed and covered by the sealing dielectric ($Si_xC_y$:$H_z$) layer (1), to seal the pores in the sidewalls of the porous dielectric layer (2) and to avoid pinhole formation in the metal diffusion barrier layer (7), not shown. The sealing dielectric layer (1) will also avoid in case a CVD or ALCVD metal diffusion barrier (7) is deposited that metal will penetrate through the pores when they are connected.

Figure 3:
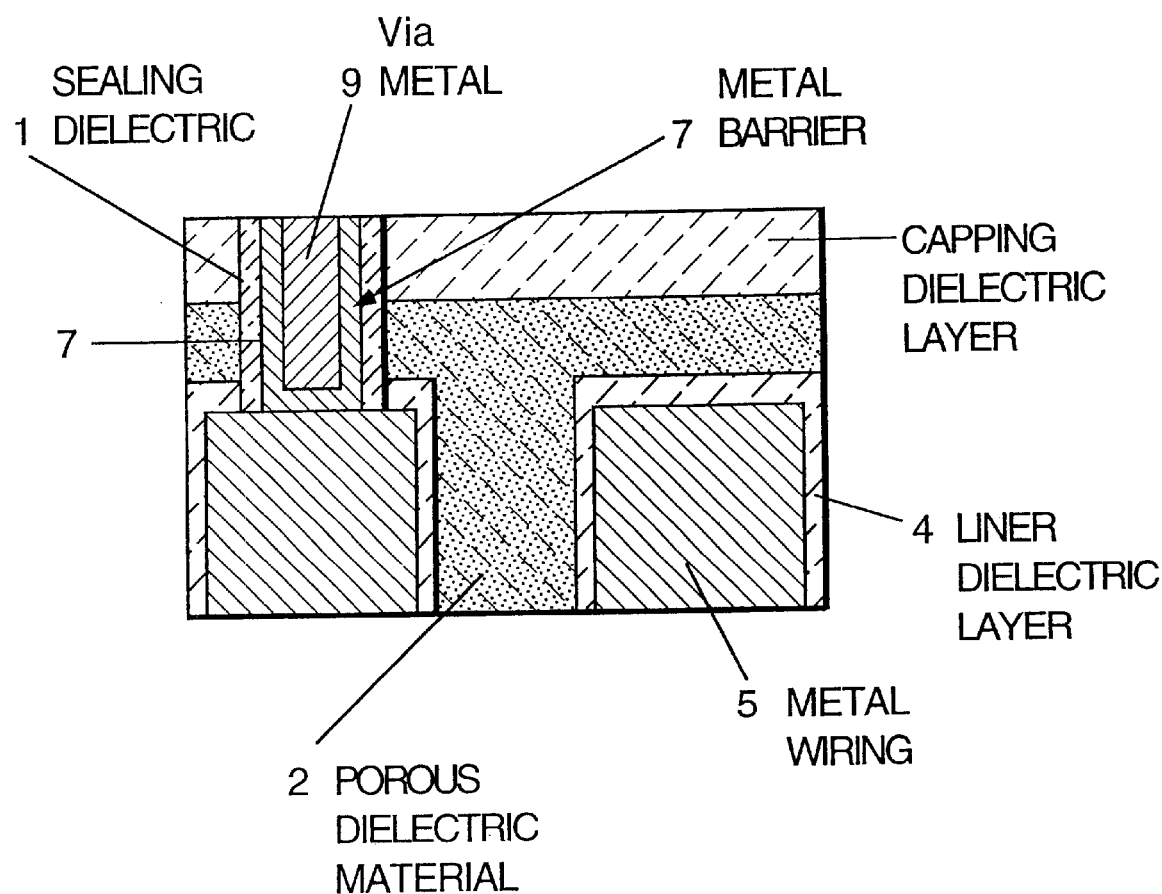
FIG. 3 is a partial cross-section of a semiconductor device according to this invention formed using subtractive aluminum technology.

FIG. 3 a partial cross section of a device formed using subtractive Al technology. When subtractive technology is used the sealing dielectric layer (1) can be applied to seal the pores of the porous dielectric layer (2) of the wall of the interconnect opening (6) (via wall) to avoid pinholes in the metal diffusion barrier layer (7) (e.g. sputtered Ti or Ti/TiN layer). The pinholes in the metal diffusion barrier (7) may lead to interaction of $WF_6$ with Ti in case W plug technology is applied to form the via metal (9). The technology is also applicable for hot aluminum to achieve a reliable flow of the interconnect metal. The interconnect metal will not flow well if Ti is not covering the sidewall and bottom of the interconnect opening (6).

The sealing dielectric layer (1) will cover the bottom of the interconnect opening (6) for all 3 described devices. The bottom of the sealing dielectric layer (1A) can be removed by using sputtering or etching like a soft sputter etch or dry etching so a good contact is made between all metal interconnects. This means that the sealing dielectric layer (1) can be removed from on top of the porous dielectric layer and in the bottom of the interconnect opening (6). There may more materials removed on the top than in the bottom of the interconnect opening (6). For example, some of the hard mask (4) may be removed due to A/R depended effects during sputtering or etching.

This invention is not intended to be limited to the application of the sealing dielectric layer in the described structures. Alternative structures where a SixCy:Hz film provides sealing of patterned structures in an integrated circuit may also be used herein. It is also applicable for flat panel displays (FPD), microsystem and optical devices.

The material used for the metal wiring layer is not limited to copper or aluminum interconnects. Additionally, the metal wiring layers can be silver, gold, alloys, superconductors and others.

The dielectric sealing layer on integrated circuit subassemblies are generally used together with a metal diffusion barrier depending of the type of interconnect structure and/or metal that is used. Methods for depositing the sealing dielectric layers are known in the art. The specific method utilized is not critical. Examples of such processes include plasma enhanced vapor deposition (PECVD), low pressure chemical vapor deposition (LPCVD), sub atmospheric chemical vapor deposition (SACVD), chemical vapor deposition techniques such as conventional CVD, photochemical vapor deposition, electron cyclotron resonance (ECR), jet vapor deposition, etc. and a variety of physical vapor deposition techniques such as sputtering, electron beam evaporation, etc. These processes involve either the addition of energy (in the form of heat, plasma, etc.) to a vaporized species to cause the desired reaction or the focusing of energy on a solid sample of the material to cause its deposition.

Materials suitable for forming the $Si_xC_y H_z$ sealing dielectric layers are also known in the art. The precursor may be a single compound that provides the Si, C, and H elements for example, an alkyl silane, silacyclobutane or a polycarbosilanes. Or the precursor can be a mixture of compounds to provide the Si, C, and H elements, for example, silane, and an organic compound (e.g. methane). Preferably the precursor is an alkylsilane, more preferably trimethylsilane.

Oxygen is not being intentionally added into the $Si_xC_yH_z$ film however, it is known that small amounts of oxygen can be present in the $Si_xC_yH_z$ film.

Additionally, it is anticipated that a sealing dielectric layer having the composition of $Si_aO_bC_c$:$H_d$ where a has a value of 10 to 33, preferably 18 to 20 atomic %, b has a value of 1 to 40, preferably 18 to 21 atomic percent, c has a value of 1 to 66, preferably 31 to 38 atomic % and d has a value of 0.1 to 60, preferably 25 to 32 atomic %; and a+b+c+d≧90 % atomic %; and C/Si<0.5 and H/C>0.5 would be useful herein. $Si_aO_bC_cH_d$ films have a lower dielectric constant layers and thus reduce any negative impact on the effective dielectric constant. Or the sealing dielectric layer it can be can be comprised of layers of $Si_xC_y$:$H_z$ and $Si_aO_bC_c$:$H_d$ to assure no degradation to the porous material.

To produce a sealing dielectric layer having the composition of $Si_aO_bC_c$:$H_d$ a controlled amount of oxygen may be present in the deposition chamber. The oxygen may be controlled by the type of oxygen providing gas used, or by the amount of oxygen providing gas that is used. If too much oxygen is present in the deposition chamber a silicon oxide film with a stoichiometry close to $SiO_2$ will be produced and the dielectric constant will be higher than desired and the sealing properties will not be achieved without degrading the porous dielectric layer. Oxygen providing gases include, but are not limited to air, ozone, oxygen, nitrous oxide and nitric oxide, preferably nitrous oxide. The amount of oxygen providing gas is typically less than 5 volume parts oxygen providing gas per volume part of silicon containing compound, more preferably from 0.01 to 4.5 volume parts of oxygen providing gas per volume part of silicon containing compound. One skilled in the art will be able to readily determine the amount of oxygen providing gas based on the type of oxygen providing gas and the deposition conditions.

In addition to the oxygen providing gas, oxygen may be introduced by the use of silicon containing compounds that contain oxygen, for example, 2,4,6,8-tetramethylcyclotetrasiloxane, 2,4,6,8,10-pentamethylcyclopentasiloxane.

Additionally, it is anticipated that a sealing dielectric layer having the composition of $Si_eN_fC_g:H_h$ where e has a value of 10 to 33, preferably 18 to 20 atomic %, f has a value of 1 to 50, g has a value of 1 to 66, preferably 31 to 38 atomic % and h has a value of 0.1 to 60, preferably 25 to 32 atomic %; e+f+g+h≧90 atomic %; and C/Si<0.5 and H/C>0.5 would be useful herein. To produce a sealing dielectric layer having the composition of $Si_eN_fC_g:H_h$ a controlled amount of nitrogen may be present in the deposition chamber. The nitrogen may be controlled by the type of nitrogen providing gas used, or by the amount of nitrogen providing gas that is used.

Silicon containing compounds useful in producing the sealing dielectric layer include, but are not limited to silanes, organosilanes, polycarbosilanes, cyclic siloxanes, and linear siloxanes. Useful silicon containing compounds are disclosed in detail in U.S. Pat. No. 6,162,742, herein incorporated by reference for it's teaching of silicon containing compounds. The silicon containing compounds typically contain a unit having the formula R-Si where the R group is selected from a hydrogen atom, a fluorine atom, a fluoro substituted organo group, or an organo group. R is preferably an alkyl group, more preferably a methyl group. The Si atom may be bonded to additional R groups (organo silanes), other Si atoms through hydrocarbon groups (polycarbosilanes) or other Si atoms through O atoms (siloxanes). Preferred silicon containing compounds are those that are gases or liquids near room temperature and can be volatilized above about 10 Torr.

The silicon containing compounds useful in producing the sealing dielectric layer may be exemplified by, but not limited to, silane, tetrafluorosilane, trifluoromethyl trifluorosilane, methylsilane, dimethylsilane trimethylsilane, tetramethylsilane, disilanomethane, bis(methylsilano) methane, 1,2-disilanoethane, 1,2-bis(methylsilano)ethane, 2,2-disilanopropane, 1,3,5-trisilano-2,4,6-trimethylene, 1,3-dimethylsiloxane, 1,3-bis(silanomethylene)disiloxne, bis(1-methyldisiloxanyl)propane, 2,4,6,8-tetramethylcyclotetrasiloxane, 2,4,6,8,10-pentamethylcyclopentasiloxane, 1,3,5,7-tetrasilano-2,6-dioxy-4,8-dimethylene, tetrapropargylsilane, tetraethynylsilane, phenylsilanes, silacyclobutane ($H_2SiC_3H_6$) and derivatives such as 1,1-difluorosilacyclobutane, 1-methylsilacyclobutane, 1,1-dimethylsilacyclobutane, 1,1-ethylmethylsilacyclobutane, 1-butylsilacyclobutane, 2,4-dimethylsilacyclobutane, 3,3-diethylsilacyclobutane, and 3,3-ethylpropylsilacyclobutane, 1,3-disilacyclobutane and derivatives such as 1,1,3,3-tetrafluoro-1,3-disilacyclobutane, 1-methyl-1,3-disilacyclobutane, 1,3-dimethyl-1,3-disilacyclobutane, 1,1-ethylmethyl-1,3-disilacyclobutane, 1-butyl-1,3-disilacyclobutane, 2,4-dimethyl-1,3-disilacyclobutane, 2,2-diethyl-1,3-disilacyclobutane, and 2,4-ethylpropyl-1,3-disilacyclobutane. A combination of two or more silicon containing compounds can be employed to provide a blend of desired properties such as dielectric constant, oxide content, hydrophobicity, film stress and plasma etching characteristics.

When the silicon-containing compound does not contain sufficient carbon to produce the desired films, carbon may be introduced through the use of a hydrocarbon such as methane.

Other elements, such as fluorine (F) can be introduced into the sealing dielectric layer so long as these elements do not materially change the sealing properties of the film.

The following represent the elements identified FIGS. 1, 2 and 3. These elements are not limited to the specific designs in the figures.

1: Sealing dielectric layer. $Si_xC_y:H_z$ where x has a value of 10–50, preferably 25–35 atomic percent, y has a value of 1–66, preferably 30–40 atomic % and z has a value of 0.1–66, preferably 25–35 atomic %; and x+y+z≧90 atomic %; or $Si_aO_bC_c:H_d$ where a has a value of 10 to 33, preferably 18 to 20 atomic %, b has a value of 1 to 40, preferably 18 to 21 atomic percent, c has a value of 1 to 66, preferably 31 to 38 atomic % and d has a value of 0.1 to 60, preferably 25 to 32 atomic %; and a+b+c+d≧90 atomic % and C/Si<0.5 and H/C>0.5; or $Si_eN_fC_g:H_h$ where e has a value of 10 to 33, preferably 18 to 20 atomic %, f has a value of 1 to 50, g has a value of 1 to 66, preferably 31 to 38 atomic % and h has a value of 0.1 to 60, preferably 25 to 32 atomic %; e+f+g+h≧90 atomic %; and C/Si<0.5 and H/C>0.5.

2: Porous dielectric layer. Porosity of 10 to 60% where the connectivity is between 1 and 100%. May be produced from Porous SiLK™, MesoELK™, XLK™, Nanoglass™, JSRLKD™, Zircon™ materials and by CVD methods such as Orion™. Methods of producing are known in the art.

3: Etch stop. Materials are typically silicon nitride, silicon carbide, $SiO_2$. One skilled in the art will know which materials are suitable based on etch selectivity to the porous material.

4: Sacrificial hard mask. Materials are typically silicon nitride, silicon carbide, $SiO_2$. One skilled in the art will know which material is suitable based on the etch selectivity to the underlying material.

5: Metal wiring. Produced from copper, aluminum silver, gold, alloys, superconductors and other conductive metals. The metal wiring can be produced by CVD, physical vapor deposition (PVD), or electrochemical deposition methods or combinations 6: Interconnect openings. Sometimes referred to as vias or trenches. Produced by removing all layers above a wiring metal and exposing at least some of the surface of the wiring metal. Methods for forming interconnect openings are well known in the art.

7: Metal diffusion barrier. Useful materials for forming the metal diffusion barrier are known in the art such as Ta, TaN, Ti, TiN, TiSiN, WN, WCN or combinations thereof The metal diffusion barrier may be applied by techniques known in the art such as sputtering (i.e. PVD), chemical vapor deposition (CVD) or atomic layer chemical vapor deposition (ALCVD).

8: Metal wiring barrier. Materials typically used to form the metal wiring barrier layer are SiC, SiN, SiCN. Methods for producing such layers are well known in the art.

9: Via Metal. This metal is used to connect the various wiring layers. The metal can be the same as the metal used to form the metal wiring (6) or can be different. Examples of via metals include, but are not limited to Cu, W, Al.

10: Interconnect Metal is the wiring metal and/or the via metal

It is believed that the sealing layer provides a better surface for the metal diffusion barrier layer than that which is provided with the porous dielectric layer.

The following non-limiting examples are provided so that one skilled in the art may more readily understand the invention.

EXAMPLES

Comparative Example 1

A 20 nm film of TaN was deposited by PVD on the trenches and sidewalls of a semiconductor device having a porous low k dielectric layer produced by the method of U.S. Pat. No. 6,231,989 formed thereon. The device was then subjected to a 20" dip test in 1% HF. SEM results showed a high density of pinholes in the barrier layer through which the acid could easily diffuse and etch the low-k layer. Evaluation by Ellipsometric Porosimetry showed toluene adsorption. Further evaluations showed that a film of TaN having a thickness of at least 30 nm would be required to seal the porous layer.

Example 1

A 10 nm SiC film was deposited by PECVD using trimethylsilane on the trenches and sidewalls of a semiconductor device having a porous low k dielectric layer produced by the method of U.S. Pat. No. 6,231,989 formed thereon. A 10 nm TaN film was formed on the SiC layer using the same process as used in Comparative Example 1. The resulting device was then subjected to a 1' dip test in 1% HF. SEM results showed no results of etching in the low-k layer and evaluation by Ellipsometric Porosimetry showed no toluene adsorption indicating that the pores were sealed.

What is claimed is:

1. An integrated circuit having
   (i) a subassembly of solid-state devices
   (ii) metal wiring formed from conductive metals wherein the metal wiring connects the devices within the subassembly
   (iii) a porous dielectric layer formed over the conductive metals wherein said porous dielectric layer contains pores
   (iv) interconnect openings formed in the porous dielectric layer
   (v) a sealing dielectric layer covering pores of the porous dielectric within the interconnect opening
   (vi) a metal diffusion barrier within the interconnect opening
   wherein said sealing dielectric layer is selected from
   (1) $Si_xC_y:H_z$ where x has a value of 10–50, y has a value of 1–66, z has a value of 0.1–66 and $x+y+z \geq 90$ atomic %;
   (2) $Si_aO_bC_c:H_d$ where a has a value of 10 to 33, b has a value of 1 to 40, c has a value of 1 to 66, d has a value of 0.1 to 60, $a+b+c+d \geq 90$ atomic % and C/Si<0.5 and H/C>0.5; or
   (3) $Si_eN_fC_g:H_h$ where e has a value of 10 to 33, f has a value of 1 to 50, g has a value of 1 to 66, h has a value of 0.1 to 60, $e+f+g+h \geq 90$ atomic %; and C/Si<0.5 and H/C>0.5.

2. The integrated circuit as claimed in claim 1 wherein the sealing dielectric layer is $Si_xC_y:H_z$ where x has a value of 10 to 50 atomic percent, y has a value of 1 to 66 atomic percent, z has a value of 0.1 to 66 atomic percent, and $x+y+z \geq 90$ atomic %.

3. The integrated circuit as claimed in claim 2 wherein the sealing dielectric layer is $Si_xC_y:H_z$ where x has a value of 25 to 35 atomic percent, y has a value of 30 to 40 atomic percent, and z has a value of 25 to 35 atomic %.

4. The integrated circuit as claimed in claim 1 wherein the sealing dielectric layer is $Si_aO_bC_c:H_d$ where a has a value of 10 to 33 atomic percent, b has a value of 1 to 40 atomic percent, c has a value of 1 to 66 atomic percent, d has a value of 0.1 to 60 atomic percent, $a+b+c+d \geq 90$ atomic % and C/Si<0.5 and H/C>0.5.

5. The integrated circuit as claimed in claim 4 wherein the sealing dielectric layer is $Si_aO_bC_c:H_d$ where a has a value of 18 to 20 atomic percent, b has a value of 18 to 21 atomic percent, c has a value of 31 to 38 atomic percent, d has a value of 25 to 32 atomic percent.

6. The integrated circuit as claimed in claim 1 wherein the sealing dielectric layer is $Si_eN_fC_g:H_h$ where e has a value of 10 to 33 atomic percent, f has a value of 1 to 50 atomic percent, g has a value of 1 to 66 atomic percent, h has a value of 0.1 to 60 atomic percent, $e+f+g+h \geq 90$ atomic %; and C/Si<0.5 and H/C>0.5.

7. The integrated circuit as claimed in claim 6 wherein the sealing dielectric layer is $Si_eN_fC_g:H_h$ where e has a value of 18 to 20 atomic percent, f has a value of 1 to 50 atomic percent, g has a value of 31 to 38 atomic percent, h has a value of 25 to 32 atomic percent.

8. The integrated circuit as claimed in claim 1 wherein the porous dielectric layer has a total porosity of 10 to 60% and the connectivity between the pores is between 0 and 100%.

9. The integrated circuit as claimed in claim 1 where in the metal diffusion barrier is selected from Ta, TaN, Ti, TiN, TiSiN, WN, WCN or combinations thereof.

10. The integrated circuit as claimed in claim 1 wherein the metal wiring is produced from copper, aluminum, silver, gold, alloys, or superconductors.

11. The integrated circuit as claimed in claim 1 wherein the interconnect opening have sidewalls and wherein the sealing dielectric layer is on the sidewalls of the interconnect opening.

* * * * *